US008890200B2

(12) United States Patent
Lee

(10) Patent No.: US 8,890,200 B2
(45) Date of Patent: Nov. 18, 2014

(54) LIGHT EMITTING DEVICE AND LIGHTING APPARATUS HAVING THE SAME

(71) Applicant: LG Innotek Co., Ltd., Seoul (KR)

(72) Inventor: Sun Kyun Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/056,147

(22) Filed: Oct. 17, 2013

(65) Prior Publication Data
US 2014/0103380 A1 Apr. 17, 2014

(30) Foreign Application Priority Data
Oct. 17, 2012 (KR) ........................ 10-2012-0115322

(51) Int. Cl.
H01L 33/00 (2010.01)
H01L 21/02 (2006.01)
H01L 33/20 (2010.01)
H01L 33/22 (2010.01)
(52) U.S. Cl.
CPC ............ H01L 33/22 (2013.01); H01L 21/0242 (2013.01); H01L 21/0243 (2013.01); H01L 21/02639 (2013.01); H01L 33/007 (2013.01); H01L 21/02647 (2013.01); H01L 33/20 (2013.01); H01L 21/02458 (2013.01); H01L 21/0237 (2013.01); H01L 21/0254 (2013.01); H01L 21/02433 (2013.01)
USPC .......................................................... 257/98
(58) Field of Classification Search
CPC .............. H01L 25/167; H01L 21/0243; H01L 21/0242; H01L 33/20; H01L 33/22
USPC .................. 257/94, 95, 98, E33.064
See application file for complete search history.

(56) References Cited

U.S. PATENT DOCUMENTS

| 2005/0082546 | A1 | 4/2005 | Lee et al. ........................ 257/79 |
| 2005/0179130 | A1* | 8/2005 | Tanaka et al. ................. 257/730 |
| 2005/0221521 | A1 | 10/2005 | Lee et al. ......................... 438/29 |
| 2006/0267025 | A1 | 11/2006 | Wuu et al. ....................... 257/79 |
| 2007/0259504 | A1 | 11/2007 | Bour et al. ..................... 438/341 |
| 2009/0267098 | A1* | 10/2009 | Choi .............................. 257/98 |

(Continued)

FOREIGN PATENT DOCUMENTS

EP 2 390 928 A2 11/2011
EP 2 573 826 A1 3/2013

(Continued)

OTHER PUBLICATIONS

European Search Report dated Jan. 27, 2014 issued in Application No. 13 18 7851.
Japanese Office Action dated Sep. 18, 2014 issued in Application No. 2013-215177.

Primary Examiner — Brook Kebede
(74) Attorney, Agent, or Firm — Ked & Associates, LLP

(57) ABSTRACT

A light emitting device includes a substrate including a plurality of convex portions, and a first semiconductor layer over the substrate. A plurality of first pits is provided in a top surface of the first semiconductor layer, and a plurality of second pits is provided in the top surface of the first semiconductor layer. A first metallic compound is provided in the first pits, and a second metallic compound is provided in the second pits. A second semiconductor layer is provided over the first semiconductor layer, and a light emitting structure is provided over the second semiconductor layer. The light emitting structure includes a first conductive semiconductor layer, an active layer, and a second conductive semiconductor layer.

20 Claims, 8 Drawing Sheets

(56) References Cited

U.S. PATENT DOCUMENTS

| | | |
|---|---|---|
| 2010/0025684 A1 | 2/2010 | Shinohara et al. ............... 257/49 |
| 2010/0133548 A1 | 6/2010 | Arena et al. ..................... 257/76 |
| 2011/0062479 A1 | 3/2011 | Sugano et al. ................... 257/98 |
| 2011/0121334 A1 | 5/2011 | Dai et al. ......................... 257/98 |
| 2011/0291070 A1 | 12/2011 | Won et al. ......................... 27/13 |
| 2011/0309329 A1 | 12/2011 | Sugawara ........................ 257/15 |
| 2012/0138947 A1 | 6/2012 | Li et al. ............................ 257/76 |

FOREIGN PATENT DOCUMENTS

| | | |
|---|---|---|
| JP | 2003-142414 A | 5/2003 |
| JP | 2003-151910 A | 5/2003 |
| JP | 2005-286291 A | 10/2005 |
| JP | 2009-124174 A | 6/2009 |
| JP | 2011-114337 A | 6/2011 |
| JP | 2012-004459 A | 1/2012 |

* cited by examiner

LIGHT EMITTING DEVICE AND LIGHTING APPARATUS HAVING THE SAME

CROSS-REFERENCE TO RELATED APPLICATIONS

The present application claims priority under 35 U.S.C. §119(a) of Korean Patent Application No. 10-2012-0115322 filed on Oct. 17, 2012, which is hereby incorporated by reference in its entirety.

BACKGROUND

1. Field

The embodiment relates to a light emitting device and a lighting apparatus having the same.

2. Background

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compositional formula of $In_xAl_yGa_{1-x-y}N$ ($0 \le x \le 1$, $0 \le y \le 1$, and $0 \le x+y \le 1$).

The LED is a semiconductor device, which transmits/receives signals by converting an electric signal into infrared ray or light using the characteristics of compound semiconductors. The LED is also used as a light source.

The LED or the LD using the nitride semiconductor material is mainly used for the light emitting device to provide the light. For instance, the LED or the LD is used as a light source for various products, such as a keypad light emitting part of a cellular phone, an electric signboard, and a lighting device.

The above references are incorporated by reference herein where appropriate for appropriate teachings of additional or alternative details, features and/or technical background.

SUMMARY

The embodiment provides a light emitting device including a silicon oxide disposed between the compound semiconductor layer and a convex portion of a substrate.

The embodiment provides a light emitting device including a silicon oxide in a pits corresponding to a convex portion of a substrate.

The embodiment provides a lighting apparatus having a light emitting device.

According to one embodiment, there is provided a light emitting device including a substrate including a plurality of convex portions; a first semiconductor layer disposed on the top surface of the substrate; a plurality of first pits disposed in a top surface of the first semiconductor layer and overlapped with the convex portions; a plurality of second pits disposed in the top surface of the first semiconductor layer and disposed in regions between the convex portions; a first metallic compound provided in the first pits to make contact with upper portions of the convex portions; a second metallic compound disposed in the second pits; a first conductive semiconductor layer disposed on the first and second metallic compounds and the first semiconductor layer; an active layer on the first conductive semiconductor layer; and a second conductive semiconductor layer on the active layer.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

Figure 1:
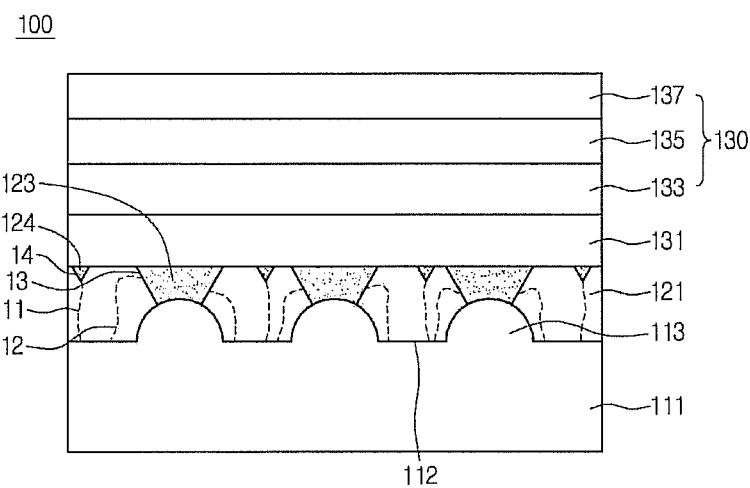
FIG. 1 is a side sectional view showing a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings. The thickness and size of each layer shown in the drawings may be exaggerated, omitted or schematically drawn for the purpose of convenience or clarity. In addition, the size of elements does not utterly reflect an actual size.

Hereinafter, embodiments will be described with reference to accompanying drawings.

Figure 2:
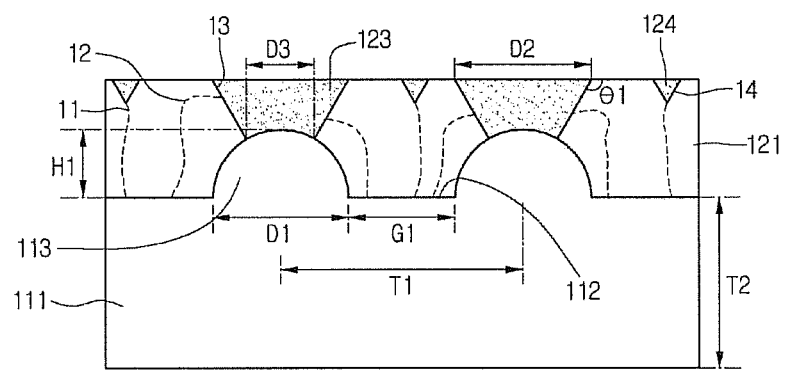
FIG. 2 is a partially enlarged view of FIG. 1.
Figure 3:
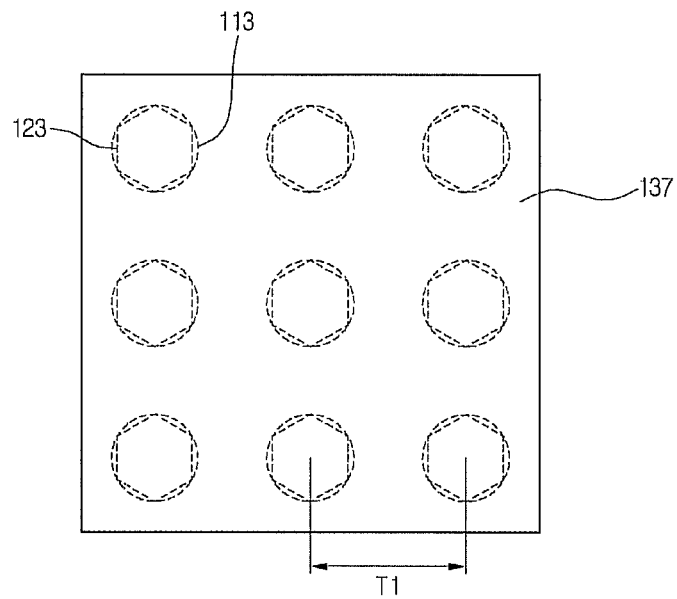
FIG. 3 is a plan view of the light emitting device of FIG. 1.

FIG. 1 is a perspective view showing a light emitting device according to the first embodiment. FIG. 2 is a partially enlarged view showing a convex portion of the substrate of FIG. 1. FIG. 3 is a plan view of the light emitting device of FIG. 1.

Referring to FIGS. 1 to 3, the light emitting device 100 includes a substrate 111 having a plurality of convex portions 113, a first semiconductor layer 121 having pits 13 and 14, metallic compounds 123 and 124, a second semiconductor layer 131, a first conductive semiconductor layer 133, an active layer 135, and a second conductive semiconductor layer 137.

The substrate 111 may include a transparent substrate, an insulating substrate or a conductive substrate. For example, the substrate 111 may include at least one of $Al_2O_3$, SiC, Si, GaAs, GaN, ZnO, Si, GaP, InP, Ge, and $Ga_2O_3$. The substrate 111 may have a thickness T2 in the range of 120 μm to 500 μm and a refractive index of 2.4 or less, or, for example, 2 or less. The substrate 111 may include a sapphire substrate. The sapphire substrate may include a transparent material. The sapphire substrate has a symmetric crystal structure of a hexa-rhombo (R3c). The sapphire substrate has a lattice constant of 13.001 Å in a c-axis direction, and a lattice constant of 4.765 Å in an a-axis direction. In addition, the sapphire substrate has C (0001) plane, A (1120) plane and R (1102) plane. Since the C (0001) plane of the sapphire substrate allows a nitride thin film to be easily grown and is stable at a high temperature, the sapphire substrate is mainly used as a substrate for growing a nitride material, but the embodiment is not limited thereto.

The lengths of adjacent sides of the substrate 111 may be equal to or different from each other. The adjacent sides may form an area of 0.3 mm×0.3 mm or greater, or for example, a large area of 1 mm×1 mm or greater. The substrate 111 may have a polygonal shape such as a rectangular shape or a hexagonal shape.

The substrate 111 includes the plurality of convex portions 113. The convex portions 113 may be provided on an upper portion of the substrate 111. The convex portions 113 may protrude in the direction of the active layer 135.

The side sectional surface of each convex portion 113 may have a semi-sphere shape, a convex dome lens shape, or a convex lens shape and as another example, may have a polygonal shape, but the embodiment is not limited thereto.

As shown in FIG. 3, the convex portions 113 may be spaced from each other and may be arranged in the form of a lattice, a matrix and a stripe shape. The gaps T1 may be formed between the convex portions 113 regularly, irregularly or randomly, but the embodiment is not limited thereto. The convex portion 113 allows the critical angle of the incident light to be changed, so that the light extraction efficiency can be improved.

The bottom width D1 of the convex portion 113 may be formed at a rate in the range 0.25 times to 4 times based on the distance G1 of the concave region 112. When the bottom width D1 of the convex portion 113 is out of the rate, the light extraction efficiency is not improved. Further, when the distance G1 of the concave region 112 is too short, a semiconductor layer is not formed on the concave region 112. In addition, when the distance G1 of the concave region 112 is too long, the improvement of the light extraction efficiency may be insufficient. The height H1 of the convex portion 113 may be formed at a rate in the range 0.3 times to 8 times based on the distance G1 of the concave region 112 and the light extraction efficiency may vary depending on the rate. When the height H1 of the convex portion 113 is out of the above rate, the improvement of the light extraction efficiency may be insufficient. The bottom width D1 of the convex portion 113 may be in the range of 1 μm to 4 μm and the distance G1 of the concave portion 112 may be in the range of 1 μm to 4 μm. In addition, the height H1 of the convex portion 113 may be in the range of 0.5 μm to 3.5 μm. The ranges of the bottom width D1 and height H1 of the convex portion 113 and the distance G1 of the concave portion 112 are proposed for preventing the concave region 112 from being unformed and maximizing the light extraction efficiency.

A first semiconductor layer 121 may be formed on the substrate 11 by selectively using II to VI compound semiconductors. The first semiconductor layer 121 may be formed in at least one layer by using II to VI compound semiconductors. For example, the first semiconductor layer 121 may be formed by using a compound semiconductor material having a compositional formula of $Al_yIn_xGa_{(1-x-y)}N$ ($0 \leq x \leq 1$, $0 \leq y \leq 1$, $0 \leq x+y \leq 1$). Typically, the first semiconductor layer 121 may include at least one of GaN, InN, AlN, InGaN, AlGaN, InAlGaN and AlInN.

The first semiconductor layer 121 may be prepared as an undoped semiconductor layer. The undoped semiconductor layer may have electrical conductivity lower than that of an n-type semiconductor layer.

Since the convex portion 113 may include the inclined or curved surface, the first semiconductor layer 121 is not normally grown. Thus, if the first semiconductor layer 121 is grown at a predetermined thickness, the first semiconductor layer 121 is grown while being stacked on the circumference of the convex portion 113. Then first pit is formed on the convex portion 113 and a second pit 14 is formed along a dislocation 11 on the first semiconductor layer 121. As shown in FIG. 3, a top surface of the first pits 13 has a hexagonal shape and a side sectional surface of the first pits 13 has V or U-shape. The second pits 14 have a polygonal shape and include a side sectional surface of a V or U-shape. A thickness of the first semiconductor layer 121 may be formed at a thickness thicker than the height H1 of the convex portion 113. For example, the first semiconductor layer 121 may have a thickness in the range of 0.7 μm to 5.3 μm. Therefore, the first pit 13 has a depth deeper than the vertex of the convex portion 113 and the depth may be exposed to one-third or more of the height H1 of the convex portion 113. The second pit 14 is formed in a concave shape having a predetermined depth on the first semiconductor layer 121.

Dislocations 11 and 12 may be formed in the first semiconductor layer 121. The dislocations 11 and 12 may be generated due to the lattice constant difference between the surface of the substrate 111 and the first semiconductor layer. The generated dislocations 11 and 12 may extend in a semiconductor growing direction, for example, in a vertical direction. In addition, a part of the dislocations 11 and 12 may extend in the horizontal direction after it has been formed in the vertical direction. The path of the dislocations 11 and 12 may be changed. One of the dislocations 11 and 12 extending in the vertical direction may be called a vertical dislocation and a remaining part of the dislocations 11 and 12 progressing to the horizontal direction from the vertical direction may be called a horizontal dislocation. The dislocation may be defined as a threading dislocation or a defect (dislocation). When the dislocations 11 and 12 are transferred to a top surface of the active layer 135, an ESD characteristic may be deteriorated due to the dislocations 11 and 12, so this is a factor of decreasing the reliability of the light emitting device. According to the embodiment, the dislocations 11 and 12 are prevented from being transferred into the active layer 135, so that the ESD characteristic is improved and the electrical reliability of the light emitting device is improved.

When the first pit 13 is not formed on the first semiconductor layer 121, the convex portions 113 are closed by the first semiconductor layer 121. In this case, the second dislocations 12 in the first semiconductor layer 121 are formed in a dislocation group on the convex portions 113 again and the dislocation group is transferred to another layer. In other words, a new dislocation is caused in an interface between the first semiconductor layer 121 and the vertexes of the convex portions 113, and the new dislocation is grouped with any other dislocations and transferred to any other layer. The dislocation generated as described above may more deteriorate the ESD characteristic when comparing with other dislocations. According to the embodiment, the first and second pits 13 and 14 are formed in the first semiconductor layer 121. The metallic compounds 123 and 124 are provided in the first and second pits 13 and 14, so that a new dislocation may be generated through the first and second pits 13 and 14, the transferring of the dislocation may be restrained. The first metallic compound 123 is provided in the first pits 13 and makes contact with the surface of the convex portion 113 and the inside of the first semiconductor layer 121. The second metallic compound 124 is provided in the second pits 14. The second metallic compound 24 may make contact with the first semiconductor layer 121 and the first dislocation 11 disposed in the second pit 14. The inclined surface of the first metallic compounds 123 may be formed at the same angle θ1 as that of the inclined surface of the first pit 13.

The lower width D3 of the first pit 13 corresponds to a direct length of the exposed region of the convex portion 113, and for example, may be formed in the range of 0.5 μm to 1 μm. The width of the first metallic compound 123 may be narrower than or equal to the lower width D3 of the first pit 13, and may be equal to or narrower than the upper width D2 of the first pit 13. The first pit 13 is filled with the first metallic compound 123, the lower surface of which may be concaved.

The first metallic compound 123 covers the side surface of the first pit 13 in which the vertex of the convex portion 113 and the second dislocations 12 are gathered, so that the dislocation may be prevented from being transferred into any other layers while growing a semiconductor layer and the crystalline of the nitride semiconductor may be improved, so the electrical reliability and internal quantum efficiency may be improved. The first metallic compound 123 corresponding to the vertex of the convex portion 113 may have a central region formed at a thin thickness, and the thickness of the first metallic compound 123 may be gradually thickened as going away from the vertex of the convex portion 113. Further, the second metallic compound 124 is formed on the first dislocation 11 so that the second pit 14 may be prevented from being transferred. The first metallic compound 123 may block the second dislocations 12 transferred to the first pit 13 and the second metallic compound 124 may block at least one dislocation 11 transferred to the second pit 14.

The metallic compounds 123 and 124 may include at least one of an insulating material, a metallic material and a metallic oxide. The metallic compounds 123 and 124 may include silicon nitride or silicon oxide. The silicon nitride includes $Si_xN_y$ such as SiN or $Si_3N_4$. The silicon oxide may include SiOx such as $SiO_2$.

Since the first and second metallic compounds 123 and 124 have refractive indexes different from those of the substrate 111 and the nitride semiconductor, external quantum efficiency may be improved. A space may be further formed between the first metallic compound 123 and the convex portion 113. A medium such as air may be filled in the space. In addition, a space may be formed below the first metallic compound 123, but the embodiment is not limited thereto.

In this case, a dislocation density of the first semiconductor layer 121 is reduced. The dislocation density of the top surface of the first semiconductor layer 121 is reduced lower than that of the bottom surface of the first semiconductor layer 121. For example, the dislocation density of the top surface of the first semiconductor layer 121 is reduced by 70% or more based on the dislocation density of the bottom surface of the first semiconductor layer 121. In addition, the dislocation density of the top surface of the first semiconductor layer 121 is reduced lower than the dislocation density in the first semiconductor layer 121. Thus, the dislocation transferred from the first semiconductor layer 121 into the active layer 135 is reduced, so that inside quantum efficiency may be improved. In addition, since the metallic compounds 123 and 124 are filled in all of the pits 13 and 14 in the first semiconductor layer 121, the dislocation transferred through the pits 13 and 14 may be blocked by 100%, so that the surface crystalline of the second semiconductor layer 131 may be improved.

The second semiconductor layer 131 is formed on the first semiconductor 121 and the first metallic compound 123. The bottom surface of the second semiconductor layer 131 may be formed in a concavo-convex structure by the curved portion of the first pit 13 and the top surface may be flat. The second semiconductor layer 131 may prevent extension of the first and second pits 13 and 14 which exist in the first semiconductor layer 121 and may suppress or block the extension of the dislocations 11 and 12 existing in the first semiconductor layer 121. Thus, the defect density in the top surface of the second semiconductor layer 131 is decreased to less than that in the first semiconductor layer 121. For example, the defect density in the top surface of the second semiconductor layer 131 is decreased in the range of $1 \times 10^6$ to $1 \times 10^8$ $cm^{-2}$. The crystal qualities of the second semiconductor layer 131 and the light emitting structure 130 may be improved and the optical power of the light emitting device and the electrical reliability may be improved.

The second semiconductor layer 131 may be formed by adding a first conductive impurity or may be a semiconductor layer undoped with any conductive impurities. The second semiconductor layer 131 may include the first conductive semiconductor layer such as an N-type semiconductor layer, but the embodiment is not limited thereto. For example, the second semiconductor layer 131 may be formed by using a compound semiconductor material having a compositional formula of $Al_yIn_xGa_{(1-x-y)}N$ ($0 \le x \le 1$, $0 \le y \le 1$, $0 \le x \le 1$). Typically, the second semiconductor layer 131 may include at least one of GaN, InN, AlN, InGaN, AlGaN, InAlGaN and AlInN.

The light emitting structure 130 may be formed on the second semiconductor layer 131. The light emitting structure 130 may include a group III-V compound semiconductor. For example, the light emitting structure 130 may include semiconductors having the compositional formula of $In_xAl_yGa_{1-x-y}N$ ($0 \le x \le 1$, $0 \le y \le 1$, $0 \le x+y \le 1$), so that the light emitting structure 130 can emit the light having a predetermined peak wavelength in the wavelength range of an ultraviolet ray band to a visible ray band.

The light emitting structure 130 includes the first conductive semiconductor layer 133, the second conductive semiconductor layer 137, and the active layer 135 between the first conductive semiconductor layer 133 and the second conductive semiconductor layer 137.

The first conductive semiconductor layer 133 may be formed on the second semiconductor layer 131. The first conductive semiconductor layer 133 may include a group III-V compound semiconductor doped with a first conductive dopant. For example, the first conductive semiconductor layer 133 may include one compound semiconductor such as GaN, InN, AlN, InGaN, AlGaN, InAlGaN or AlInN. For example, the first conductive semiconductor layer 133 may be formed as an N type semiconductor layer having the compositional formula of $In_xAl_yGa_{1-x-y}N$ ($0 \le x \le 1$, $0 \le y \le 1$, $0 \le x+y \le 1$) and the first conductive dopant is an N type dopant including Si, Ge, Sn, Se or Te.

A superlattice structure including various semiconductor layers alternately stacked on each other may be formed between the first conductive semiconductor layer 133 and the second semiconductor layer 131. The superlattice structure may reduce the lattice defect. Each layer of the superlattice structure may have a thickness in the range of a few Å.

A clad layer (not shown) may be formed between the first conductive semiconductor layer 133 and the active layer 135. The clad layer may include a GaN-based semiconductor and have a bandgap higher than that of the active layer 135. The clad layer may include an N-type semiconductor layer and confines the carriers.

The active layer 117 is formed under the first conductive semiconductor layer 115. The active layer 117 selectively includes a single quantum well structure, a multiple quantum well (MQW) structure, a quantum wire structure or a quantum dot structure and may have a periodicity of the well layer and the barrier layer. The well layer may have a compositional formula of $In_xAl_yGa_{1-x-y}N$ ($0 \leq x \leq 1$, $0 \leq y \leq 1$, $0 \leq x+y=1$) and the barrier layer may have a compositional formula of $In_xAl_yGa_{1-x-y}N$ ($0 \leq x \leq 1$, $0 \leq y \leq 1$, $0 \leq x+y \leq 1$). The well layer/barrier layer may have at least one periodicity by using the stack structure of InGaN/GaN, GaN/AlGaN, InGaN/AlGaN, InGaN/InGaN, InAlGaN/InAlGaN, or AlInN/InGaN. The barrier layer may include a semiconductor material having a bandgap higher than that of the well layer.

The second conductive semiconductor layer 137 may include a semiconductor doped with a second conductive dopant. For example, the second conductive semiconductor layer 137 may include one of compound semiconductors such as GaN, InN, AlN, InGaN, AlGaN, InAlGaN or AlInN. For example, the second conductive semiconductor layer 137 may be formed as a P type semiconductor layer having the compositional formula of $In_xAl_yGa_{1-x-y}N$ ($0 \leq x \leq 1$, $0 \leq y \leq 1$, $0 \leq x+y \leq 1$) and the second conductive dopant is a P type dopant including Mg, Zn, Ca, Sr or Ba.

The second conductive semiconductor layer 137 may include a superlattice structure, such as InGaN/GaN or AlGaN/GaN. The superlattice structure of the second conductive semiconductor layer 127 may spread the current abnormally contained in the voltage, thereby protecting the active layer 135.

In addition, the first conductive semiconductor layer 133 may be prepared as a P type semiconductor layer and the second conductive semiconductor layer 137 may be prepared as an N type semiconductor layer. A third conductive semiconductor layer having polarity opposite to that of the second conductive semiconductor layer 137 may be formed under the second conductive semiconductor layer 137.

The light emitting structure 130 may be defined by the first conductive semiconductor layer 133, the active layer 135 and the second conductive semiconductor layer 137. The light emitting structure 130 may be implemented in one of an N-P junction structure, a P-N junction structure, an N-P-N junction structure, and a P-N-P junction structure. In this case, the symbols "N" and "P" represent N and P type semiconductor layers, respectively, and the symbol "-" represents that two layers are directly or indirectly stacked on each other. Hereinafter, the second conductive semiconductor layer 137 will be referred to as the uppermost layer of the light emitting structure 130 for the purpose of convenience of explanation.

An electric power may be supplied to the first and second conductive semiconductor layers 133 and 137 by connecting electrodes to the first and second conductive semiconductor layers 133 and 137.

According to the embodiment, defects may be reduced in the active layer. The embodiment may provide a device having a greater resistance against electrostatic discharge (ESD). According to the embodiment, a light absorption may be minimized in a semiconductor and a scattered reflection is generated so that light extraction efficiency may be improved. According to the embodiment, the light emitting device of blocking a dislocation caused on a convex portion is provided so that electrical reliability may be improved.

FIGS. 4 to 7 are views showing a process of fabricating a light emitting device. Although the following description is made based on the individual device to facilitate the explanation, the light emitting device is manufactured in the wafer level and the individual device is manufactured through the process described later. However, the manufacture of the individual device is not limited to the process described later, but the process steps may be increased or reduced to manufacture the individual device.

Figure 4:
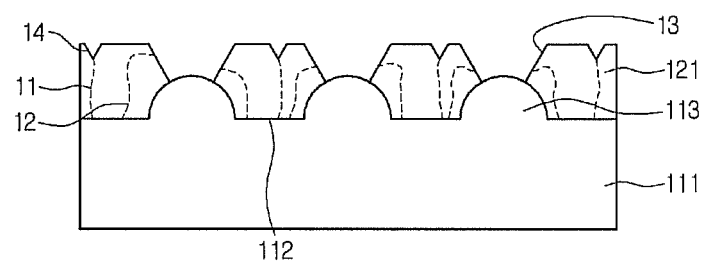
FIG. 4 is a sectional view showing an example of forming a first semiconductor layer on a substrate in a process of fabricating a light emitting device according to the embodiment.

Referring to FIG. 4, the substrate 111 is loaded in growth equipment, and the compound semiconductor including group II to VI elements may be selectively used to be formed on the substrate 111 in the form of a layer or a pattern. The substrate 111 serves as a growth substrate.

The substrate 111 may include a transparent substrate, an insulating substrate or a conductive substrate. For instance, the substrate 111 may include one selected from the group consisting of $Al_2O_3$, GaN, SiC, ZnO, Si, GaP, InP, $Ga_2O_3$, and GaAs. The convex portions 113 are formed on the substrate 111. The convex portions 113 may be formed by etching the substrate 111 using a predetermined mask pattern disposed on the substrate 111.

A plurality of compound semiconductor layers may be grown on the substrate 111. The growth equipment for growing the compound semiconductor multilayer includes an E-beam evaporator, PVD (physical vapor deposition) equipment, CVD (chemical vapor deposition) equipment, PLD (plasma laser deposition) equipment, a dual-type thermal evaporator, sputtering equipment, or MOCVD (metal organic chemical vapor deposition) equipment, but the embodiment is not limited thereto.

The first semiconductor layer 121 is grown on the substrate 111. A strain is caused on the interface between the substrate 111 and the first semiconductor layer 121 due to a lattice constant difference. The stress is caused by the dislocations 11 and 12 when growing the first semiconductor layer 121 and the dislocations 11 and 12 extend in the growing direction of the first semiconductor layer 121. In this case, the first semiconductor layer 121 is grown from a planar surface (0001) of the substrate through a surface of the convex portion 113. The first pit 13 is formed on the convex portion 113 and the volume and size of the first pit 13 is adjusted by controlling the growing temperature of the first semiconductor layer 121. The first pit 13 may be exposed as the second dislocation 12 extends. The second pit 14 may be formed on the first dislocation 11 of the dislocations 11 and 12.

Figure 5:
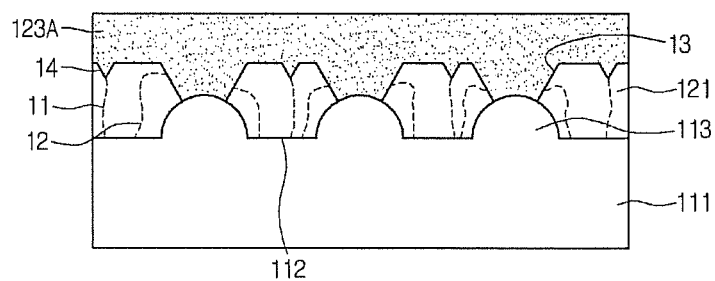
FIG. 5 is a sectional view showing an example of forming a metallic compound layer on the first semiconductor layer of FIG. 4.

Referring to FIG. 5, a metallic compound layer 123A may be formed on the first semiconductor layer 121. The metallic compound layer 123A may be formed from the top surface of the first semiconductor layer 121 at a predetermined thickness. The metallic compound 123A may include silicon nitride or silicon oxide. The silicon nitride includes $Si_xN_y$ such as SiN or $Si_3N_4$. The silicon oxide may include SiOx such as $SiO_2$. In this case, the first and second pits 13 and 14 are filled with the metallic compound layer 123A.

The metallic compound layer 123A may be formed in the same chamber. The temperature of forming the metallic compound layer 123A is in the range of 900° to 1100° and silicon precursor is supplied into the atmosphere of ammonia (NH3). The silicon precursor may include SiH4, Si2H6 or DTBSi (ditertiarybutyl silane). The pits 123 and 124 may be filled with the metallic compound layer 123A. The supply of the precursor is interrupted later. The metallic compound layer 123A may include a pore which is generated when the metallic compound layer 123A is formed in the pits 13 and 14. The pore minimizes a light absorption caused in the semiconductor and generates a scattered reflection, so that the light output may be increased.

Figure 6:
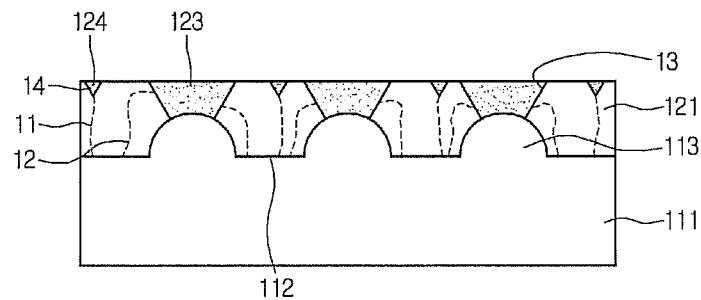
FIG. 6 is a sectional view after etching the metallic compound layer of FIG. 5.

Referring to FIGS. 5 and 6, the metallic compound layer 123A is etched. The metallic compound layer 123A is etched to the top surface of the first semiconductor layer 121 by using at least one of dry and wet etchings. The dry etching may be performed by using excimer ($Cl_2$+ArF), Ti:sapphire, or Nd—YAG laser. The wet etching may be performed by using aqua regia, KOH, $HNO_3$, HCL, $CH_3COOH$, $H_3PO_4$, $H_2SO_4$, KOH in $H_2O$, KOH in ethylene glycol ($Ch_2OH_2OH$), NaOH in $H_2O$, or NaOH in ethylene glycol. Although the etching temperature varies depending on an etching scheme, the etching temperature may be set in the range of 0° to 200°.

By the etching process, the first metallic compound 123 is provided in the first pit 13 and the second metallic compound 124 is provided in the second pit 14.

Figure 7:
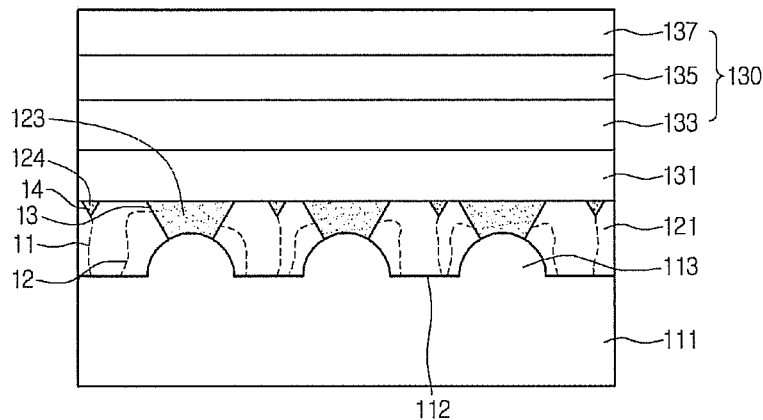
FIG. 7 is a sectional view showing an example of forming the second semiconductor layer and the light emitting structure on the first semiconductor layer and the metallic compound layer of FIG. 6.

Referring to FIG. 7, the second semiconductor layer 131 is formed on the first semiconductor layer 121 and the first metallic compound 123. The second semiconductor layer 131 may be formed of a compound semiconductor the same as or different from that of the first semiconductor layer 121. The second semiconductor layer 131 may be grown while filling the first and second pits 13 and 14 by controlling vertical and horizontal growing speeds. The growing speed may be controlled by a flow rate, a pressure and growing temperature of the precursor and the growing temperature may be 100° or above.

A light emitting structure 130 including a first conductive semiconductor layer 133, an active layer 135 and a second conductive semiconductor layer 137 is formed on the second semiconductor layer 131. The light emitting structure 130 may be formed at three semiconductor layers or more, but the embodiment is not limited thereto. In addition, one of the first and second conductive semiconductor layers 133 and 137 or an adjacent layer thereto may include a superlattice structure having one of AlGaN/GaN/InGaN or AlGaN/GaN/InGaN, but the embodiment is not limited thereto.

Thus, the first metallic compound 123 is formed on the first pit 13 of the first semiconductor layer 121 formed on the convex portion 113 of the substrate, so that the dislocation transferred to another layer through a region of the convex portion 113 of the substrate 111 may be effectively blocked.

Figure 8:
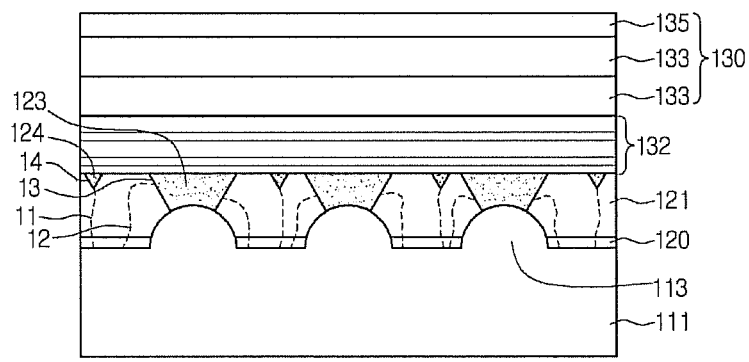
FIG. 8 is a side sectional view of a light emitting device according to the second embodiment.

FIG. 8 is a side sectional view showing a light emitting device according to the second embodiment. In the description of the second embodiment, the same configurations as those of the first embodiment will refer to the descriptions of the first embodiment.

Referring to FIG. 8, the buffer layer 120 of the light emitting device is disposed between the first semiconductor layer 121 and the substrate 111, so that the buffer layer 120 attenuates the lattice mismatch between the substrate 111 and the first semiconductor layer 121. Thus, the dislocation transferred to the first semiconductor layer 121 may be reduced. The buffer layer 120 may have a thickness of several nm or less and, for example, may include a material having the compositional formula of $In_xAl_yGa_{1-x-y}N$ ($0 \leq x \leq 1$, $0 \leq y \leq 1$, $0 \leq x+y \leq 1$), but the embodiment is not limited thereto. In this case, when the convex portion 113 has a shape of a hemisphere, the buffer layer 120 may not be normally grown at the curved portion.

The second semiconductor layer 132, which is disposed between the first semiconductor layer 121 and the first conductive semiconductor layer 133, may be formed in a superlattice structure having a multilayer. The second semiconductor layer 132 may include a plurality of layers having mutually different reflective indexes or mutually different materials and thicknesses. The second semiconductor layer 132 may include at least two pair-layers which are alternately stacked. The dislocation transferred to the first conductive semiconductor layer 133 through the superlattice structure of the second semiconductor layer 132 may be blocked. One of the first and second layers may include a compound semiconductor having the compositional formula of $In_xAl_yGa_{1-x-y}N$ ($0 \leq x \leq 1$, $0 \leq y \leq 1$, $0 \leq x+y \leq 1$).

Figure 9:
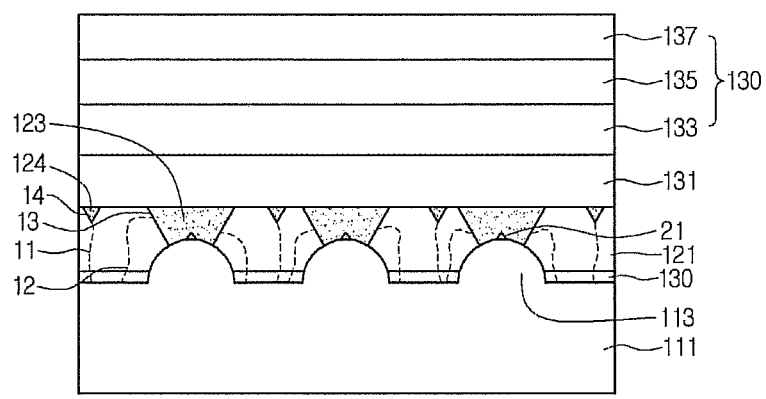
FIG. 9 is a side sectional view of a light emitting device according to the third embodiment.

FIG. 9 is a side sectional view showing a light emitting device according to the third embodiment. In the description of the third embodiment, the same configurations as those of the first and second embodiments will refer to the descriptions of the first and second embodiments.

Referring to FIG. 9, the light emitting device includes a buffer layer 120 and a first semiconductor layer 121 on the substrate 111.

A part 21 of the buffer layer 120 may be formed on the convex portion 113 of the substrate 111 and in the vertex region of the convex portion 113 to have a thickness less than that of the buffer layer 120.

The part 21 of the buffer layer 120 makes contact with the first metallic compound 123 in the first pit 13. The part 21 of the buffer layer 120 may be provided in the first metallic compound 123 in an embedded form. The first metallic compound 123 may make contact with the part 21 of the buffer layer 120 and the side surface of the first pit 12, and may effectively block the dislocation which may be transferred through the convex portion 113.

Figure 10:
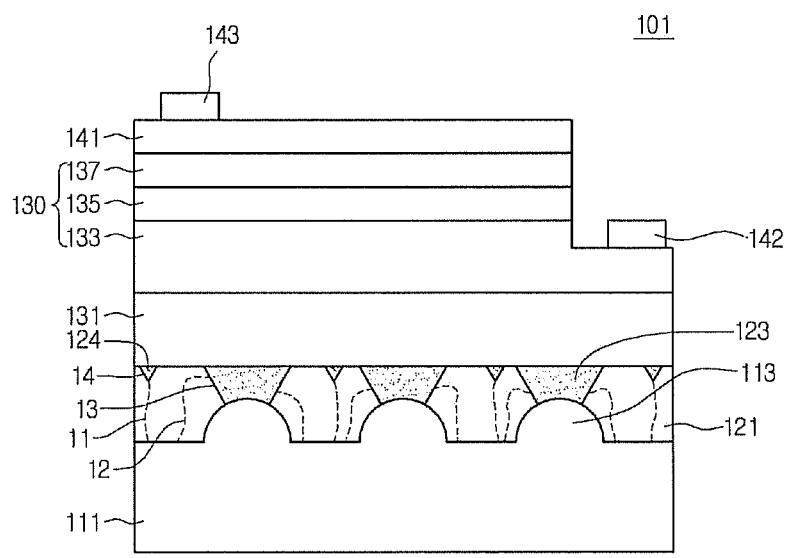
FIG. 10 is a view of disposing an electrode on the light emitting device of FIG. 1.

FIG. 10 is a view showing an example of disposing a first light emitting device. An example of disposing an electrode on the light emitting device of FIG. 1 will be described, but the description of the configuration of FIG. 1 will be omitted. In the description of FIG. 10, an example of disposing an electrode on the light emitting device of FIGS. 8 and 9 will be omitted.

Referring to FIG. 10, the light emitting device 101 includes a substrate 111, first and second semiconductor layers 121 and 131, a metallic compound 123, a light emitting structure 130, a current diffusion layer 141 on the light emitting structure 130, a first electrode 142 on the first conductive semiconductor layer 133, and a second electrode 143 on the electrode layer 141.

The electrode layer 141, which may be formed as a transparent current diffusion layer, is formed on the top surface of the second conductive semiconductor layer 137. The electrode layer 141 may be formed of a material selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ZnO, IrOx, RuOx, and NiO, and may include at least one layer. The electrode layer 141 may include a reflective electrode layer. The electrode layer 141 may include one selected from the group consisting of Al, Ag, Pd, Rh, Pt, Ir and an alloy having at least two of the above elements.

The second electrode 145 may be formed on the second conductive semiconductor layer 137 and/or the electrode layer 141, and may include an electrode pad. The second electrode 145 may form a current diffusion pattern of an arm structure or a finger structure. The second electrode 145 may be formed of a metal having properties of an ohmic contact, an adhesive layer and a bonding layer and may have non-transparent property, but the embodiment is not limited thereto.

The second electrode may be 40% or less based on a top surface area of the second conductive semiconductor layer 137, for example, 20% or less, but the embodiment is not limited thereto.

The first electrode 143 is formed on the first conductive semiconductor layer 143. The first and second electrodes 143 and 145 may include one selected from the group consisting of Ti, Ru, Rh, Ir, Mg, Zn, Al, In, Ta, Pd, Co, Ni, Si, Ge, Ag, Au, and an alloy thereof. The ESD characteristic may be reduced by suppressing the dislocation or pit in the light emitting structure 130.

An insulating layer may be further formed on the surface of the light emitting structure 130, so that the insulating layer may prevent an electrical short between the layers of the light emitting structure 130 and moisture infiltration.

Figure 11:
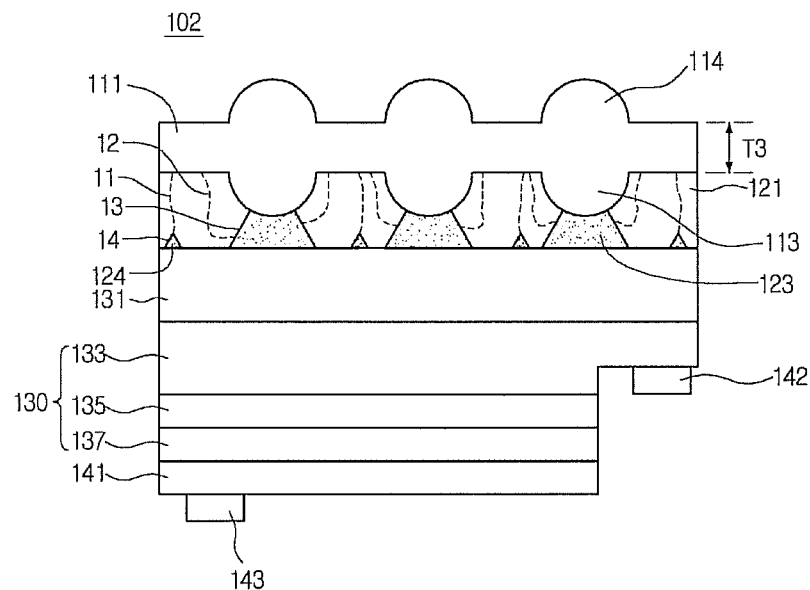
FIG. 11 is a view of disposing an electrode and a light extraction structure on the light emitting device of FIG. 1.

FIG. 11 is a view showing another example of disposing a first light emitting device. The description about several elements of FIG. 11 will be referred to the description of FIG. 10. In the description of FIG. 11, an example of disposing an electrode on the light emitting device of FIGS. 8 and 9 will be omitted.

Referring to FIG. 11, in the light emitting device 102, the electrode layer 141 is disposed below the light emitting structure 130. The electrode layer 141 may serve as a reflective electrode layer by using a metal. The first and second electrodes 142 and 143 may protrude downward and may be mounted on the substrate by a connection member, such as a bump.

The substrate 111 may have a thickness T3 in the range of 30 μm to 70 μm, but the embodiment is not limited thereto. The substrate 111 includes a plurality of convex portion 113 and a plurality of protrusions 114 on the top and bottom portions thereof. The convex portion 113 provided on the bottom portion may have a center corresponding to or offset from a center of the protrusion 114 provided on the top portion. The protrusion 114 may have a hemi-sphere shape or a polygonal shape. Such a structure is disposed in a light extraction direction, so that the light extraction efficiency can be improved.

Figure 12:
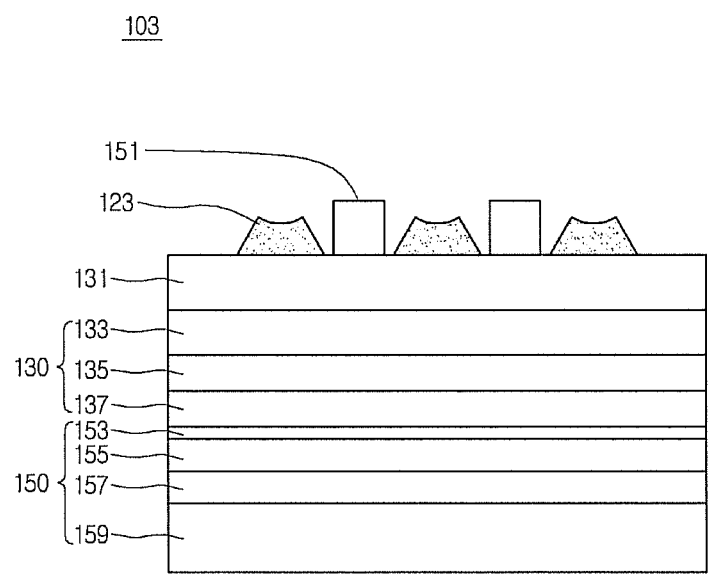
FIG. 12 is a view showing a vertical electrode disposed on the light emitting device of FIG. 1.

FIG. 12 is a side sectional view showing a vertical electrode disposed on the light emitting device of FIG. 1.

Referring to FIG. 12, the light emitting device 103 includes the first electrode 151 above the light emitting structure 130 and the second electrode 150 below the light emitting structure 130. The second semiconductor layer 131 may be provided on the light emitting structure 130 and the first electrode 151 and the first electrode 151 is provided on the second semiconductor layer 131.

The substrate 111 of FIG. 1 and the first semiconductor layer 121 provided on the second semiconductor layer 131 are removed through physical and chemical schemes. The second semiconductor layer 131 includes a conductive semiconductor layer such as an N-type semiconductor layer.

The substrate in FIG. 1 is removed. The growth substrate may be removed through a physical scheme (for example, laser lift off scheme) and/or a chemical scheme (for example, wet etching scheme), so that the second conductive semiconductor layer 131 may be exposed by removing the first semiconductor layer. The first electrode 151 is formed on the second semiconductor layer 131 by performing an isolation etching process in the direction of removing the growth substrate. Thus, the light emitting device, which includes the first electrode 151 on the light emitting structure 130 and the second electrode 150 below the light emitting structure 130 in a vertical electrode structure, may be fabricated.

The first electrode 151 may be provided in mutually different regions and may have an arm pattern or a bridge pattern, but the embodiment is not limited thereto. A region of the first electrode 151 may be used as a pad.

A plurality of first metallic compounds 123 provided on the second semiconductor layer 131 are spaced apart from each other. The first metallic compound 123 may improve the efficiency of extracting light incident through the second semiconductor layer 131. The first metallic compound 123 may protrude higher than the top surface of the second semiconductor layer 131.

The second electrode 150 may be formed below the light emitting structure, that is, the second conductive semiconductor layer 137. The second electrode 150 may include a plurality of conductive layers such as a contact layer 153, a reflective layer 155, a bonding layer 157 and a conductive support member 159.

The contact layer 153 may include a permeable conductive material or a metallic material. For example, the contact layer 153 may be formed by using a low-conductive material such as ITO, IZO, IZTO, IAZO, IGZO, IGTO, AZO or ATO, or metal such as Ni or Ag. The reflective layer 155 may be formed below the contact layer 153. The reflective layer 155 may be formed of a structure having at least one layer including a material selected from the group consisting of Ag, Ni, Al, Rh, Pd, Ir, Ru, Mg, Zn, Pt, Au, Hf and combination thereof. The reflective layer 155 may make contact with a lower surface of the second conductive semiconductor layer 137. The reflective layer 155 may make ohmic contact with the second conductive semiconductor layer 137 by using metal or a low-conductive material such as ITO, but the embodiment is not limited thereto.

The bonding layer 157 may be formed below the reflective layer 155. The bonding layer 157 may be formed by using barrier or bonding metal. The bonding layer 157 may include at least one of Ti, Au, Sn, Ni, Cr, Ga, In, Bi, Cu, Ag, Ta and alloy thereof.

The conductive supporting member 159 is formed below the bonding layer 157. The conductive supporting member 159 may be formed of a conductive material such as Cu, Au, Ni, Mo, Cu—W, or a carrier wafer (for example, Si, Ge, GaAs, ZnO, SiC, . . . ) having dopant. As another example, the supporting member 159 may be implemented by using a conductive sheet.

The light extraction structure such as a roughness may be formed on the top surface of the second conductive semiconductor layer 131. Insulating layers may be formed on surfaces of the semiconductor layers 131 to 135. A light extraction structure such as a roughness may be formed on the insulating layers.

Figure 13:
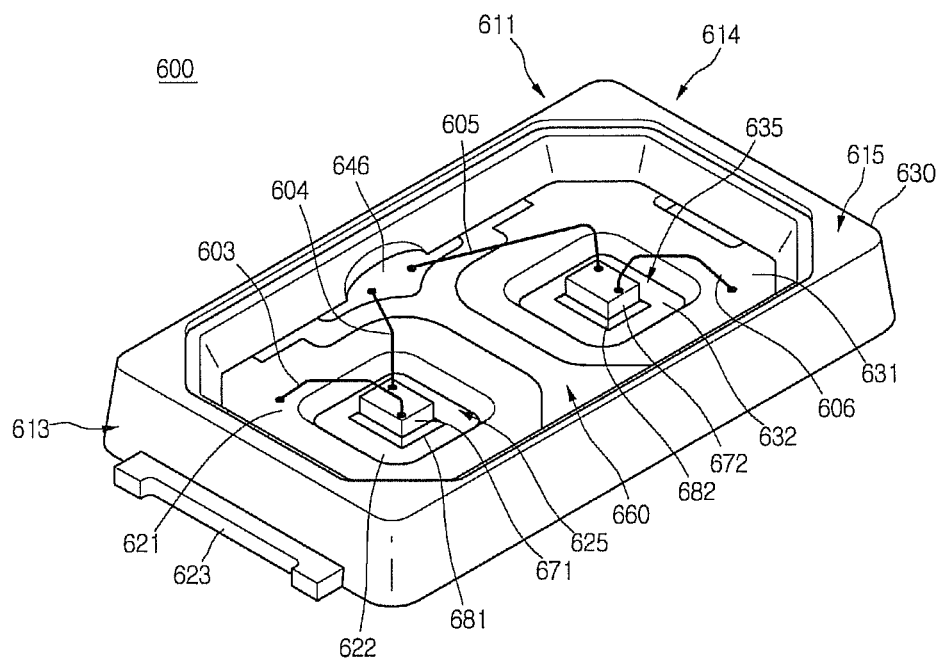
FIG. 13 is a perspective view showing a light emitting device package having the light emitting device of FIG. 9.
Figure 14:
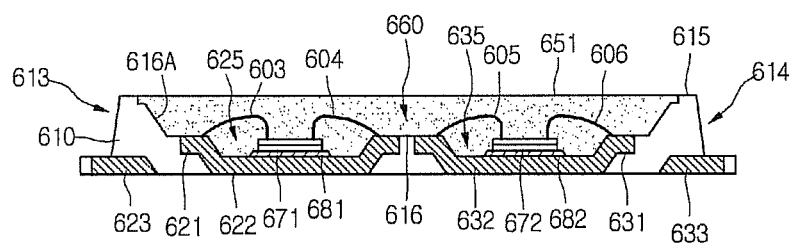
FIG. 14 is a side sectional view of the light emitting device package of FIG. 13.

FIG. 13 is a perspective view showing a light emitting device package having the light emitting device. FIG. 14 is a side sectional view of the light emitting device of FIG. 13.

Referring to FIGS. 13 and 14, the light emitting device package 600 includes a body 610 having a concave portion 660, first and second lead frames 621 and 631, a connecting frame 646, light emitting devices 603 to 606, a molding member 651 and paste members 681 and 682. The concave portion 660 may include first and second cavities 625 and 635.

The body 610 may include at least one of an insulating material, a conductive material and a metallic material. The body 610 may include at least one of a resin material, such as Polyphthalamide (PPA), silicon (Si), a metallic material, photo sensitive glass (PSG), sapphire (Al2O3), and a printed circuit board (PCB). For example, the body 610 may include a resin material such as Polyphthalamide (PPA).

The body 610 includes a plurality of side surfaces 611 to 614. A length of the first side surface 611 or the second side surface 612 may correspond to a length between the third and fourth side surfaces 613 and 614 and the longitudinal direction may pass through the center of the second and third cavities 625 and 635.

The first and second lead frames 621 and 631 may be disposed on a lower surface of the body 610 to be mounted on the circuit board. The first and second lead frames 621 and 631 may have thicknesses of 0.2 mm±0.05 mm.

The body 610 includes the concave portion 660 including an upper opened portion, a side surface 616A and a bottom 616.

The first lead frame 621 is disposed under a first region of the concave portion 660. A first cavity 625, which has a depth lower than the bottom of the concave portion 616, is provided in a central portion of the first lead frame 621. The side surface and bottom 622 of the first cavity 625 are formed by the first lead frame 621. The second lead frame 631 is disposed in a second region spaced apart from the first region. A second cavity 635, which has a depth lower than the bottom 616 of the concave portion 616, is provided in a central portion of the second lead frame 631. The side surface and bottom 632 of the second cavity 635 are formed by the second lead frame 631.

The central portions of the first and second lead frames 621 and 631 may be exposed to a lower portion of the body 610 and may be disposed on a plane which is the same as or different from a lower surface of the body 610.

The first lead frame 621 may include a first lead part 623, which may protrude from the third side surface 613 of the body 610. The second lead frame 621 may include a second lead part 633, which may protrude from the fourth side surface 614 facing the third side surface 613 of the body 610. The first and second lead frame 621 and 623 and the connecting frame 646 may include a metallic material, for example, at least one of titanium (Ti), copper (Cu), nickel (Ni), gold (Au), chrome (Cr), tantalum (Ta), platinum (Pt), tin (Sn), silver (Ag), and phosphor (P), and may be configured as a single metal layer or multilayer. The connecting frame 646 is disposed on the bottom 616 of the concave portion 660. In addition, the connecting frame 646 is disposed between the first and second lead frames 621 and 631 and serves as a middle connecting terminal.

The first light emitting device 671 is disposed in the first cavity 625 of the first lead frame 621, and the second light emitting device 672 is disposed in the second cavity 635 of the second lead frame 631.

The first light emitting device 671 is connected to the first connecting frame 621 and the connecting frame 646 through the connecting members 603 and 604. The second light emitting device 672 is connected to the second connecting frames 621 and the connecting frame 646 through the connecting members 605 and 606. The connecting members may be prepared as a wire. A protective device may be disposed on a portion of the first or second lead frame 621 or 631.

The molding member 651 may be formed in the concave portion 660, and the first and second cavities 625 and 635. The molding member 651 may be formed of a transparent resin material such as silicon or epoxy, and may be formed in a single layer or a multilayer.

A first paste member 681 is disposed between the first light emitting device 671 and the bottom 622 of the first cavity 625 such that the first light emitting device 671 and the bottom 622 of the first cavity 625 are adhesive and electrically connected to each other. A second paste member 682 is disposed between the second light emitting device 672 and the bottom 632 of the second cavity 635 such that the second light emitting device 672 and the bottom 632 of the second cavity 635 are adhesive and electrically connected to each other. The first and second pastes 681 and 682 include an insulation adhesive such as epoxy. Filler may be added to the epoxy, but the embodiment is not limited thereto.

The molding member 651 may include phosphor for converting a wavelength of light emitted to the light emitting devices 671 and 672. The phosphor may be added to the molding member 651 formed in at least one region of the first and second cavities 625 and 635, but the embodiment is not limited thereto. The phosphor excites a part of the light emitted from the light emitting devices 671 and 672 to emit the light having another wavelength. The phosphor may include one selected from YAG, TAG, Silicate, Nitride, and oxynitride materials. The phosphor may include at least one of a red phosphor, a yellow phosphor, and a green phosphor, but the embodiment is not limited thereto. A top surface of the molding member 651 may have at least one of a flat shape, a concave shape and a convex shape. For example, the top surface of the molding member 651 may be formed in a concave shape which may serve as a light exit surface.

While the current embodiment shows and describes the top view type light emitting device package, the light emitting device package may be implemented by a side view type light emitting device package to provide improved effects in the heat releasing characteristic, conductivity and reflective characteristic. In the top view type or side view type light emitting device package, after the resin layer is formed of a resin material, a lens may be formed or attached on the resin layer, but the present invention is not limited thereto.

<Lighting System>

The light emitting device according to the embodiment is applicable to a lighting system. The lighting system includes a structure in which a plurality of light emitting devices are arrayed. The lighting system includes a display apparatus shown in FIGS. 15 and 16, a lighting apparatus shown in FIG. 17, a lighting lamp, a camera flash, a signal lamp, a headlamp for a vehicle, and an electronic display.

Figure 15:
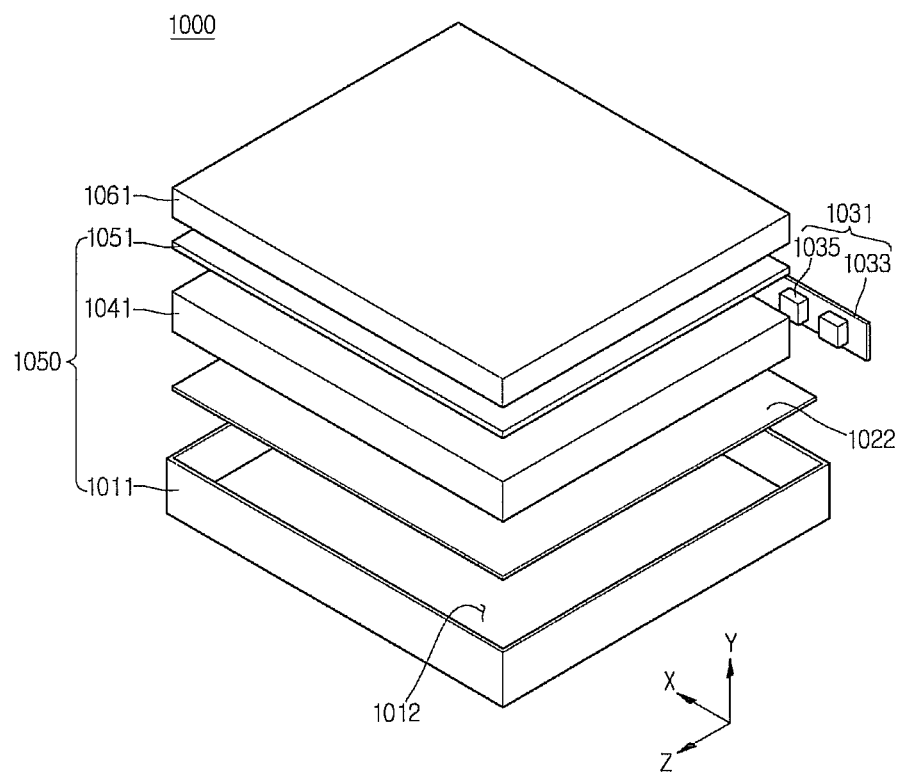
FIG. 15 is a perspective view showing a display apparatus having the light emitting device or light emitting device package according to the embodiment.

FIG. 15 is an exploded perspective view showing a display apparatus having the light emitting device according to the embodiment.

Referring to FIG. 15, a display apparatus 1000 according to the embodiment includes a light guide plate 1041, a light source module 1031 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light source module 1031, and the reflective member 1022, but the embodiment is not limited thereto.

The bottom cover 1011, the reflective sheet 1022, the light guide plate 1041, the optical sheet 1051, and the light unit 1050 may be defined as a backlight unit.

The light guide plate 1041 diffuses the light supplied from the light source module 1033 to provide surface light. The light guide plate 1041 may include a transparent material. For example, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphtha late) resin.

The light source module 1031 is disposed on at least one side of the light guide plate 1041 to supply the light to at least one side of the light guide plate 1041. The light source module 1031 serves as the light source of the display device.

At least one light source module 1031 is disposed to directly or indirectly supply the light from one side of the light guide plate 1041. The light source module 1031 may include a board 1033 and the light emitting device according to the embodiments or the light emitting device 1035. The light emitting device or the light emitting device 1035 are arranged on the board 1033 while being spaced apart from each other at the predetermined interval.

The board 1033 may include a printed circuit board (PCB) including a circuit pattern (not shown). In addition, the board 1031 may also include a metal core PCB (MCPCB) or a flexible PCB (FPCB) as well as a typical PCB, but the embodiment is not limited thereto. If the light emitting device 1035 is installed on the side of the bottom cover 1011 or on a heat dissipation plate, the board 1033 may be omitted. The heat dissipation plate partially makes contact with the top surface of the bottom cover 1011.

In addition, the light emitting device 1035 are arranged such that light exit surfaces to discharge light of the light emitting device 1035 are spaced apart from the light guide plate 1041 by a predetermined distance on the board 1033, but the embodiment is not limited thereto. The light emitting device 1035 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light source module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light source module 1031 as optical members, but the embodiment is not limited thereto.

Figure 16:
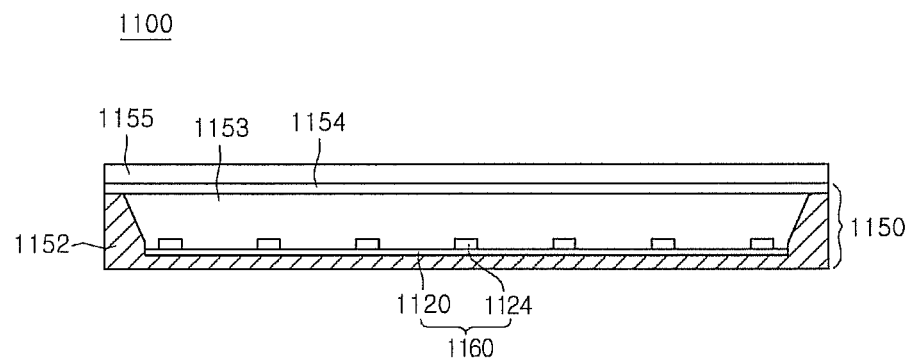
FIG. 16 is a sectional view showing a display apparatus having the light emitting device or light emitting device package according to the embodiment.

FIG. 16 is a sectional view showing a display apparatus according to the embodiment.

Referring to FIG. 16, the display device 1100 includes a bottom cover 1152, a board 1120 on which the light emitting device 1124 are arrayed, an optical member 1154, and a display panel 1155.

The board 1120 and the light emitting device 1124 may constitute the light source module 1160. In addition, the bottom cover 1152, at least one light source module 1160, and the optical member 1154 may constitute the light unit 1150. The bottom cover 1151 can be disposed with a receiving section 1153, but the embodiment is not limited thereto. The light source module 1160 includes a board 1120, and a plurality of light emitting devices arranged on the board 1120 or a light emitting device 1124.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light source module 1160 in order to convert the light emitted from the light source module 1160 into the surface light.

Figure 17:
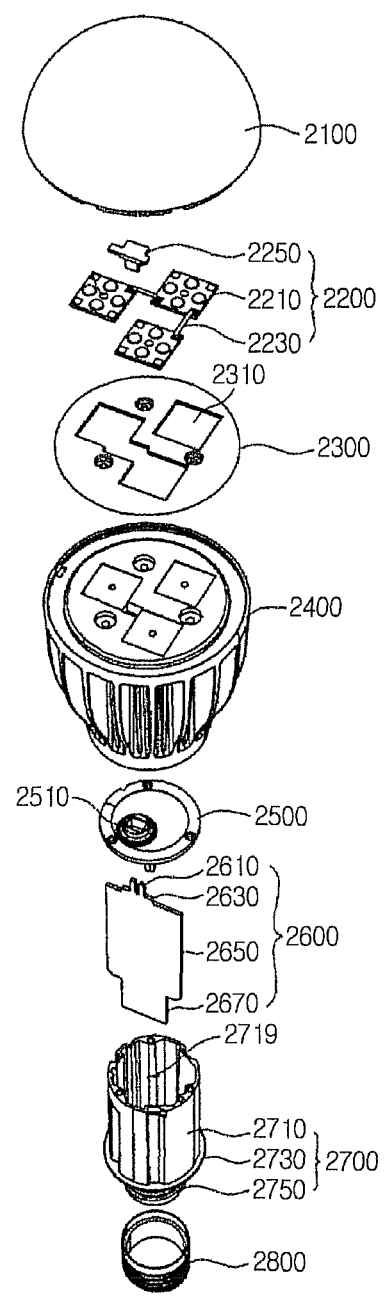
FIG. 17 is an exploded perspective view showing a lighting device having the light emitting device or light emitting device package according to the embodiment.

FIG. 17 is an exploded perspective view showing a lighting device having the light emitting device according to the embodiment.

Referring to FIG. 17, the lighting device according to the embodiment may include a cover 2100, a light source module 2200, a heat radiation member 2400, a power supply part 2600, an inner case 2700, and a socket 2800. In addition, the light emitting device according to the embodiment may further include at least one of a member 2300 and a holder 2500. The light source module 2200 may include the light emitting device according to the embodiment.

For example, the cover 2100 has the shape of a bulb, or a hemispherical shape. The cover 2100 may have a hollow structure, and a portion of the cover 2100 may be open. The cover 2100 may be optically connected to the light source module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light source module 2200 may be recognized at the outside. In addition, the cover 2100 may be opaque. The cover 2100 may be formed through a blow molding scheme.

The light source module 2200 may be disposed at one surface of the heat radiation member 2400. Accordingly, the heat emitted from the light source module 2200 is conducted to the heat radiation member 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks a receiving groove 2719 of an insulating part 2710 disposed in an internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light source module 2200. The power supply part 2600 is received in the receiving groove 2719 of the internal case 2700, and sealed in the internal case 2700 by the holder 2500.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 2650. For example, the parts include a DC converter, a driving chip to drive the light source module 2220, and an ESD (electrostatic discharge) protective device to protect the light source module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is formed by hardening a molding liquid, so that the power supply part 2600 may be fixed into the internal case 2700.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a substrate including a plurality of convex portions;
a first semiconductor layer provided over top surface of the substrate;
a plurality of first pits provided on a top surface of the first semiconductor layer and overlapped with the convex portions;
a plurality of second pits provided on the top surface of the first semiconductor layer and disposed in regions between the convex portions;
a first metallic compound provided in the first pits and contacted with upper portions of the convex portions;
a second metallic compound provided in the second pits;
a second semiconductor layer provided over the first semiconductor layer; and
a light emitting structure provided over the second semiconductor layer,
wherein the light emitting structure comprises a first conductive semiconductor layer on the second semiconductor layer, an active layer on the first conductive semiconductor layer, and a second conductive semiconductor layer on the active layer.

2. The light emitting device of claim 1, wherein the first semiconductor layer includes a plurality of dislocations connected to the first and second pits, respectively.

3. The light emitting device of claim 2, wherein the dislocations connected to the first pits progress from a vertical direction.

4. The light emitting device of claim 1, wherein the first and second metallic compounds include an insulating material.

5. The light emitting device of claim 1, wherein the first and second metallic compounds include nitride or oxide including silicon.

6. The light emitting device of claim 1, wherein a lower portion of the first metallic compound includes a concave curved surface.

7. The light emitting device of claim 1, wherein a side surface of the first metallic compound is inclined at an inclined angle equal to an inclined angle of a side surface of the first pit.

8. The light emitting device of claim 1, wherein the first metallic compound has a lower width narrower than a lower width of each convex portion.

9. The light emitting device of claim 1, wherein each convex portion has a hemisphere shape and a lower width of each convex portion is larger than a height of each convex portion.

10. The light emitting device of claim 1, wherein at least one of the first and second semiconductor layers includes an n-type dopant.

11. The light emitting device of claim 1, wherein the second pits have depths less than depths of the first pits, and are placed at positions higher than positions of the convex portions.

12. The light emitting device of claim 1, wherein top surfaces of the first and second metallic compounds are aligned on a same horizontal plane with the top surface of the first semiconductor layer.

13. The light emitting device of claim 1, further comprising a buffer layer between the substrate and the first semiconductor layer,
wherein a part of the buffer layer is disposed between the first metallic compound and the convex portion, and
the first metallic compound makes contact with a circumstance of a part of the buffer layer.

14. The light emitting device of claim 1, further comprising a pore between at least one of the convex portions and the first metallic compound.

15. The light emitting device of claim 1, wherein a dislocation density of a top surface of the second semiconductor layer is less than a dislocation density in the first semiconductor layer and is in a range of $1\times10^6$ cm$^{-2}$ to $1\times10^8$ cm$^{-2}$.

16. The light emitting device of claim 1, wherein the first and second metallic compounds comprise a material different from materials of the first and second semiconductor layers.

17. A light emitting device comprising:
a substrate including a light transparent material and including a plurality of convex portions;
a first semiconductor layer provided over the top surface of the substrate;
a plurality of first pits provided on a top surface of the first semiconductor layer and overlapped with the convex portions;
a plurality of second pits provided on the top surface of the first semiconductor layer and disposed in regions between the convex portions;
a first metallic compound provided in the first pits and contacted with upper portions of the convex portions;
a second metallic compound provided in the second pits;
a second semiconductor layer provided over the first semiconductor layer; and
a light emitting structure provided over the second semiconductor layer,
wherein the light emitting structure comprises a first conductive semiconductor layer on the second semiconductor layer, an active layer on the first conductive semiconductor layer, and a second conductive semiconductor layer on the active layer,
the first and second metallic compounds comprise a material different from materials of the first and second semiconductor layers, and
each first metallic compound has a volume greater than a volume of each second metallic compound.

18. The light emitting device of claim 16, wherein the first semiconductor layer has a thickness larger than a height of each convex portion, and
the first pits have depths deeper than depths of the second pits.

19. A light emitting device comprising:
a substrate including a light transparent material and including a plurality of convex portions;
a plurality of protrusions protruding from a bottom surface of the substrate;
a first semiconductor layer provided over the top surface of the substrate;
a plurality of first pits provided on a top surface of the first semiconductor layer and overlapped with the convex portions;
a plurality of second pits provided on the top surface of the first semiconductor layer and disposed in regions between the convex portions;
a first metallic compound provided in the first pits and contacted with upper portions of the convex portions;
a second metallic compound provided in the second pits;
a second semiconductor layer provided over the first semiconductor layer; and
a light emitting structure over the second semiconductor layer,
wherein the light emitting structure comprises a first conductive semiconductor layer on the second semiconductor layer, an active layer on the first conductive semiconductor layer, and a second conductive semiconductor layer on the active layer,
the first and second metallic compounds comprise a material different from materials of the first and second semiconductor layers,
each first metallic compound has a volume greater than a volume of each second metallic compound, and
the first metallic compound includes top surfaces having horizontal surfaces aligned on a same horizontal plane with the top surface of the first semiconductor layer and side surfaces inclined at the same angle as a side surface of the first pit.

20. The light emitting device of claim 19, wherein the first metallic compound includes a plurality of inclined side surfaces making contact with the first semiconductor layer, and a concave bottom surface making contact with surfaces the convex portions.

* * * * *